United States Patent [19]
Saitou et al.

[11] Patent Number: 4,829,444
[45] Date of Patent: May 9, 1989

[54] CHARGED PARTICLE BEAM LITHOGRAPHY SYSTEM

[75] Inventors: Norio Saitou, Iruma; Masahide Okumura, Sagamihara; Tsutomu Komoda, Tokyo; Mitsuo Ooyama, Hachioji, all of Japan

[73] Assignee: Hitachi, Ltd., Tokyo, Japan

[21] Appl. No.: 922,891

[22] Filed: Oct. 24, 1986

[30] Foreign Application Priority Data

Oct. 25, 1985 [JP] Japan .................. 60-237498

[51] Int. Cl.⁴ .................. G06F 15/20; H01J 3/14
[52] U.S. Cl. .................. 364/468; 250/492.3; 364/490
[58] Field of Search .......... 364/468, 488–491, 364/559; 250/492.1, 492.2–492.24, 492.3, 491.1; 378/34, 35

[56] References Cited

U.S. PATENT DOCUMENTS

| | | | |
|---|---|---|---|
| 4,390,788 | 6/1983 | Hayashi et al. | 250/491.1 |
| 4,390,789 | 6/1983 | Smith | 250/492.2 |
| 4,430,571 | 2/1984 | Smith | 250/492.2 |
| 4,433,384 | 2/1984 | Berrian et al. | 364/525 |
| 4,538,232 | 8/1985 | Koyama | 364/491 |
| 4,694,178 | 9/1987 | Harte | 250/396 R |

OTHER PUBLICATIONS

Nakamura et al. "A High Speed, High Precision Electron Beam Lithography System" (System Design)–J. Vac. Sci. Tech., 3(1), Jan./Feb., 1985, pp. 94–97, 106–111.

Cleaver, et al.–"A Combined Electron and Ion beam Lithography System", Journal of Vacuum Science & Technology, vol. 3, No. 1, pp. 144–147, Jan./Feb. 1985.

Roelofs, et al. "Feasibility of Multi-Beam Electron Lithography" Microelectronic Engineering, vol. 2, No. 4, pp. 259–279, Dec. 84.

Primary Examiner—Joseph Ruggiero
Attorney, Agent, or Firm—Antonelli, Terry & Wands

[57] ABSTRACT

A charged particle beam lithography system has a high-throughput and inexpensive system configuration. The system configuration is constituted by a plurality of charged particle optical systems each adapted to focus and deflect a beam of charged particles and irradiate the beam onto a specimen so that the beam draws a desired pattern on the specimen, a plurality of deflection distortion correcting circuits each associated with each of the charged particle optical systems for correcting a deflection distortion of each charged particle optical system, and a common pattern data control circuit for supplying data of a pattern to be drawn to each of the plurality of deflection distortion correcting circuits.

3 Claims, 3 Drawing Sheets

CHARGED PARTICLE BEAM LITHOGRAPHY SYSTEM

BACKGROUND OF THE INVENTION

This invention relates to a charged particle beam lithography system for use in a lithography process for manufacture of semiconductor devices and more particularly to a charged particle beam lithography system having a system configuration suitable for achieving cost reduction and high throughput.

The charged particle beam lithography system ma be classified into two types of which one uses an electron beam and the other uses an ion beam, and will conveniently be described herein by way of example of the former type.

Lithography techniques can not well comply with the recent trend toward high-density, fine semiconductor devices, without resort to an electron beam direct lithography in which an electron beam is finely focused on a wafer coated with resist so as to draw a pattern directly on the wafer. The electron beam direct lithography can fully fulfill itself in the formation of fine patterns but disadvantageously, it has a small throughput and can not therefore be practiced in the device production line on mass production basis.

In order to increase the working speed of the electron beam lithography system, many advanced elemental techniques have been developed, including an expedient for speed-up of the control circuit system described in, for example, "A high speed, high precision electron beam lithography system" by K. Nakamura et al., J. Vac. Sci. Technol., B3(1), p. 94, Jan/Feb, 1985 and an approach to a continuous stage movement system for variable shaped beam electron optics described in, for example, "An electron beam lithography system for submicron VHSIC device fabrication" by H. J. King et al., J. Vac. Sci. Technol., B3(1), p. 106, Jan/Feb, 1985.

However, even with the best combination of these elemental techniques, if the conventional system configuration in which one control circuit system controls one channel of an electron beam system is adhered to, then the throughput per channel will be technically limited and estimated to be 20 to 30 sheets/hour at the most for a wafer of 4 to 5 inches. Further, the lithography system is very costly in terms of one channel and can not be manufactured commercially with profitability.

SUMMARY OF THE INVENTION

An object of this invention is to provide a charged particle beam lithography system which can eliminate the drawbacks of the conventional lithography system by having a system configuration which can permit the charged particle beam lithography to be performed at high throughput and low cost without impairing the fine working faculty of the charged particle beam lithographic technique.

To accomplish the above object, a charged particle beam lithography system according to the invention comprises a plurality of charged particle optical systems each adapted to focus and deflect a beam of charged particles and irradiate the beam onto a specimen so that the beam draws a desired pattern on the specimen, a plurality of deflection distortion correcting circuits each associated with each of the charged particle optical systems for correcting a deflection distortion of each charged particle optical system, and a common pattern data control circuit for supplying data of a pattern to be drawn to each of the plurality of deflection distortion correcting circuits. The pattern data control circuit comprises a single pattern data memory for storing data of a pattern to be drawn so that each of the charged particle optical systems is supplied with the common pattern drawing data. Alternatively, the pattern data control circuit may comprise a plurality of pattern data memories provided in correspondence to the plurality of charged particle optical systems so that the charged particle optical systems can draw different patterns.

DESCRIPTION OF THE PREFERRED EMBODIMENTS

The invention will now be described by way of example with reference to the accompanying drawings.

Figure 1:
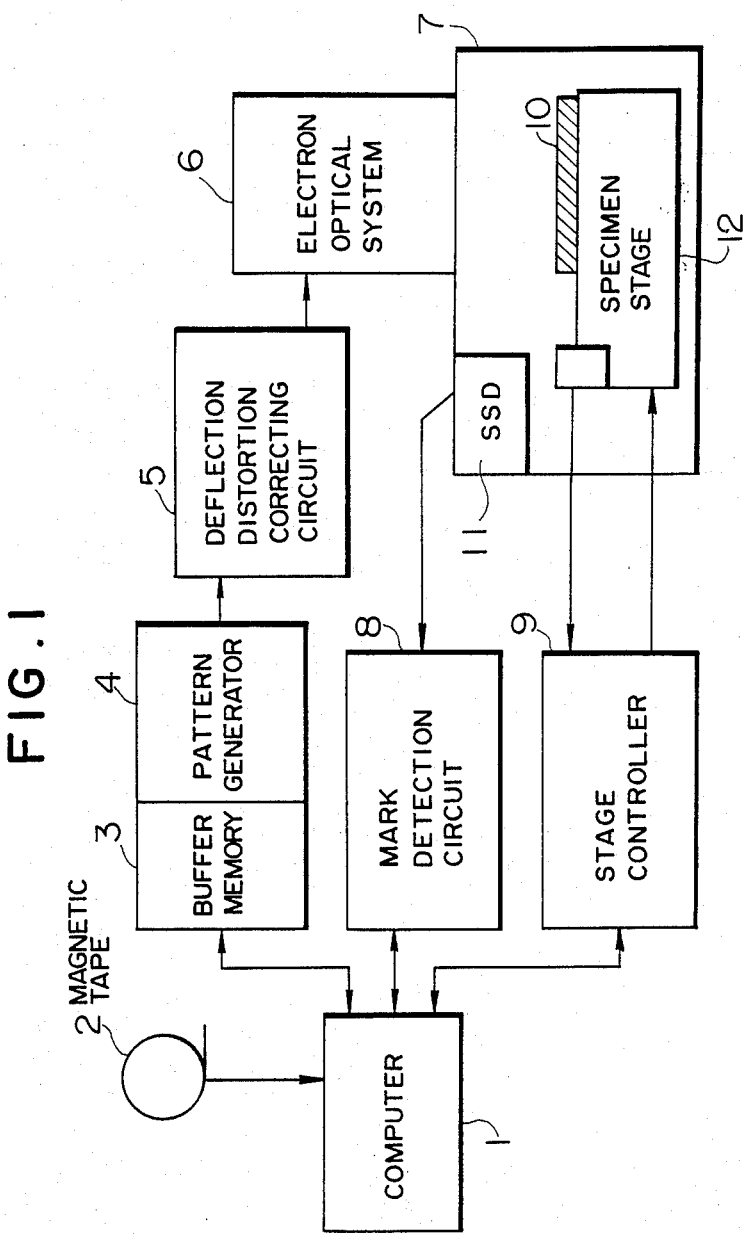
FIG. 1 is a schematic block diagram showing a system configuration of an electron beam lithography system.

In principle, an electron beam lithography system according to the invention is systemized as will be explained below with reference to FIG. 1. More particularly, a control computer 1 receives pattern data from a magnetic tape 2 and writes the data into a buffer memory 3. The pattern data is divided into pieces of drawing data by means of a pattern generator 4. The drawing data is supplied to an electron optical system 6 through a deflection distortion correcting circuit 5 and the electron optical system 6 draws a pattern in accordance with the drawing data on a wafer 10 located within a specimen chamber 7. The deflection distortion correcting circuit 5 corrects a deflection distortion for the electron beam in accordance with the data from the computer 1. The computer 1 also controls a mark detection circuit 8 which detects and processes a signal representative of a reflected electron beam sensed by a sensor 11 so as to control the position of the electron beam and controls a stage controller 9 which drives a stage 12 carrying the wafer 10.

Figure 2:
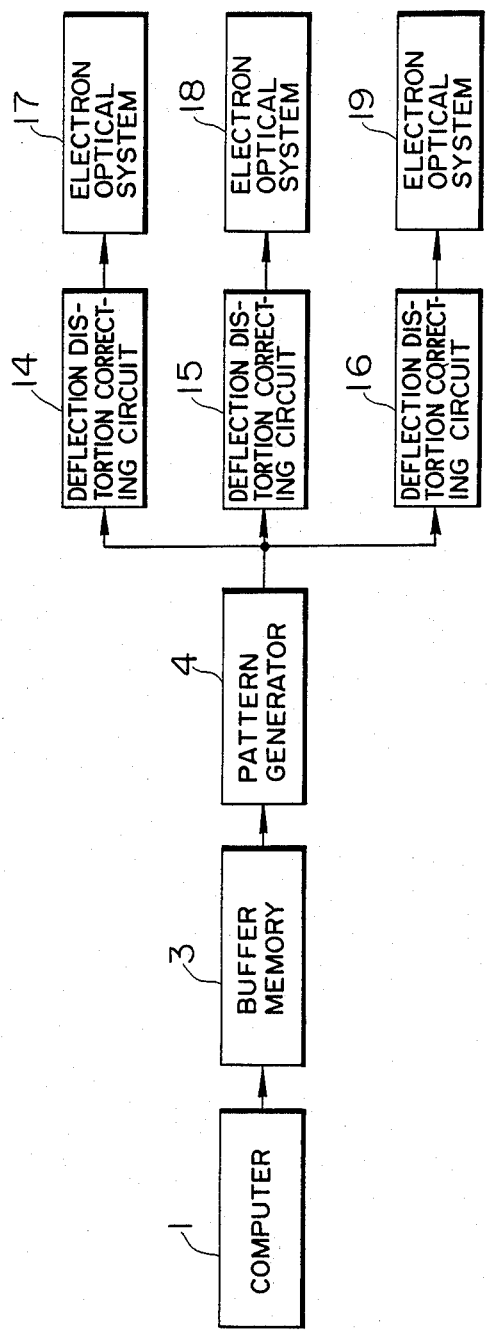
FIG. 2 is a block diagram showing an electron beam lithography system according to an embodiment of the invention.

FIG. 2 illustrates, in block form, a system configuration according to a first embodiment of the invention. This system configuration is suitable for electron beam lithography for devices such as memories required to be manufactured on mass production basis. In this embodiment, one channel comprised of a control computer 1, a buffer memory 3 for storage of pattern data and a pattern generator 4 performs simultaneous control of a plurality of electron optical systems 17 to 19 respectively associated with deflection distortion correcting circuits 14 to 16. For simplicity of illustration, three channels of electron optical systems for pattern drawing are shown herein but the number of channels is in no way limited to three.

In operation, data of a pattern to be drawn supplied from the control computer 1 is stored in the buffer memory 3. Upon issuance of an instruction for commencement of lithography, the pattern data is divided by the pattern generator 4 into pieces of drawing data representative of an irradiation unit figure which depends on a field, a sub-field and a beam shape, these factors being determined by the electron optical system. The drawing data is delivered to the electron optical systems 17 to 19 through the deflection distortion correcting circuits 14 to 16 operable to correct deflection distortions preset for individual electron optical systems, so that a pattern can be drawn on a wafer loaded in each electron optical system. The distortion correction must be different for the individual optical systems because even when all the electron optical systems are constructed under quite the same design, the deflection distortion for the electron beam travelling in the optical system slightly differs from system to system.

Since in this embodiment lithography is performed in accordance with the data stored in the buffer memory 3, all the wafers are simultaneously drawn with the same pattern. Effects of this embodiment may be estimated as below. Assuming that a single electron optical system has a throughput of 30 sheets/hour, the throughput of the lithography system is as large as $(30\times n)$ sheets/hour in total when n channels of the electron optical systems are connected in common. Considering the cost of the overall lithography system, one control circuit system ranging from the control computer 1 to the pattern generator 4 is almost identical in cost with one channel comprised of each of the deflection distortion correcting circuits 14 to 16 and each of the electron optical systems 17 to 19 and, given the same throughput, the cost of the lithography system according to this embodiment can therefore be reduced to approximately half that of the conventional lithography system when the number n of electron optical systems is large, amounting to 5, for example.

Figure 3:
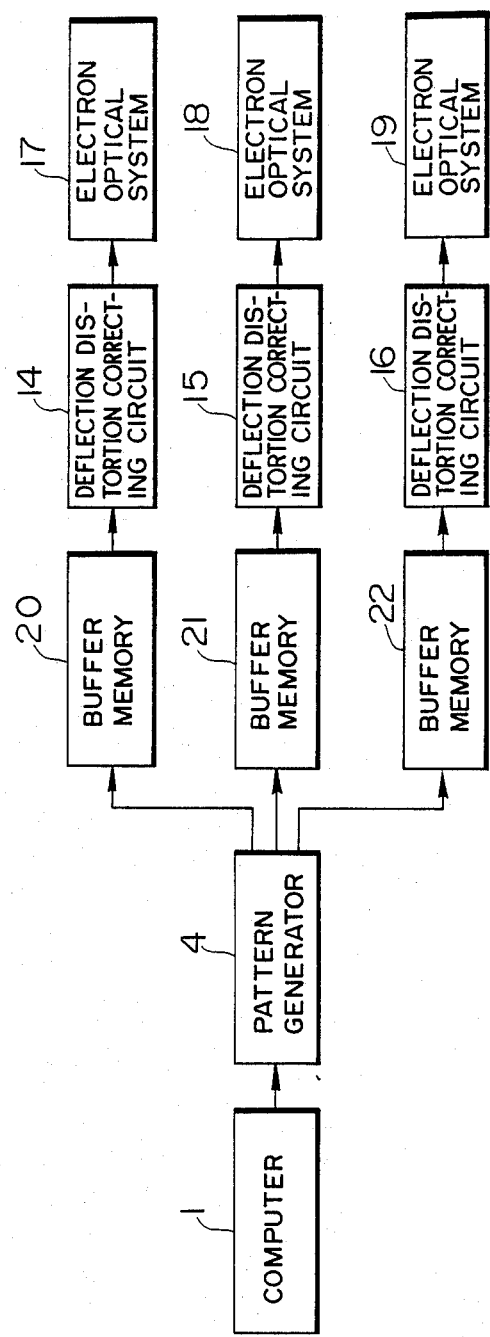
FIG. 3 is a block diagram showing an electron beam lithography according to another embodiment of the invention.

FIG. 3 illustrates, in block form, another embodiment of a system configuration. This system configuration is suitable for electron beam lithography for devices such as custom LSI's which abound in variety but are manufactured on relatively small output basis. This embodiment is different from the first embodiment in that the sequence of a series of the pattern data storage buffer memory and pattern generator is reversed. Specifically, in this embodiment, pattern data is first divided by a pattern generator 4 into pieces of drawing data, which in turn are stored in buffer memories 20, 21 and 22. It will be appreciated that the buffer memories 20, 21 and 22 are provided in correspondence to respective electron optical systems 17, 18 and 19. With this arrangement, when the buffer memories 20, 21 and 22 have been stored with different types of data for different LSI's, the individual electron optical systems 17, 18 and 19 can draw different patterns to permit simultaneous lithography for a variety of patterns. This embodiment is more costly than the first embodiment by a rise in cost due to the provision of the buffer memory for each electron optical system but the raised cost is not so expensive in total.

It should be understood that the system configuration of the electron beam lithography system described so far can obviously be applied to the other type of lithography system and a doping apparatus which are both based on an ion beam.

As described above, in a charged particle beam lithography system according to the present invention, a control circuit system controls a plurality of charged particle optical systems to ensure that the throughput can be improved and at the same time the cost of the lithography system can be reduced. To be specific, when the control circuit system controls n channels of charged particle optical systems as explained in the foregoing embodiments, the overall lithography system can have a throughput which is n times as large as that of one channel and the cost required for each channel of charged particle optical system associated with the common control circuit system can be approximately halved as compared to the conventional system configuration, in which one control circuit system controls one channel of a charged particle optical system. This permits charged particle beam lithography to be practiced on actual production line in device factories.

We claim:

1. A charged particle beam lithography system comprising:
    a plurality of charged particle optical systems each adapted to focus and deflect a beam of charged particles and irradiate said beam onto a specimen so that said beam draws a desired pattern on said specimen;
    a plurality of deflection distortion correcting circuits associated with said charged particle optical systems for correcting a deflection distortion of each charged particle optical system respectively;
    a plurality of pattern data memories associated with said deflection distortion correcting circuits respectively with different memories having different data patterns stored therein;
    a common pattern data control circuit for supplying data of a pattern to be drawn individually to said pattern data memories so that said memories enable storage of data patterns that are different from each other and capable of being drawn at the same time; and
    means for drawing different data patterns at the same time.

2. A charged particle beam lithography system according to claim 1, wherein said charged particle beam is an electron beam.

3. A charged particle beam lithography system according to claim 1, wherein said charged particle beam is an ion beam.

* * * * *